(12) United States Patent
Lo et al.

(10) Patent No.: US 12,349,398 B2
(45) Date of Patent: Jul. 1, 2025

(54) HIGH VOLTAGE DEVICE AND MANUFACTURING METHOD THEREOF

(71) Applicant: Richtek Technology Corporation, Zhubei (TW)

(72) Inventors: Kuo-Hsuan Lo, Taoyuan (TW); Chien-Hao Huang, Penghu (TW); Yu-Ting Yeh, Miaoli (TW); Chu-Feng Chen, Hsinchu (TW); Wu-Te Weng, Hsinchu (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 429 days.

(21) Appl. No.: 17/847,053

(22) Filed: Jun. 22, 2022

(65) Prior Publication Data
US 2023/0253494 A1 Aug. 10, 2023

(30) Foreign Application Priority Data

Feb. 8, 2022 (TW) .................................. 111104517

(51) Int. Cl.
*H10D 30/00* (2025.01)
*H01L 21/265* (2006.01)
(Continued)

(52) U.S. Cl.
CPC ....... *H10D 30/65* (2025.01); *H01L 21/26513* (2013.01); *H01L 21/266* (2013.01);
(Continued)

(58) Field of Classification Search
CPC ........... H01L 29/7816; H01L 29/66681; H01L 29/402; H10D 30/65; H10D 30/0281; H10D 64/111
See application file for complete search history.

(56) References Cited

U.S. PATENT DOCUMENTS 10,861,946 B1 12/2020 Ho et al.
10,923,589 B2 2/2021 Huang et al.
(Continued)

FOREIGN PATENT DOCUMENTS

TW 1740719 B 9/2021

OTHER PUBLICATIONS

Tang et al., "Characteristics and Breakdown Behaviors of Polysilicon Resistors for High Voltage Applications." Advances in Condensed Matter Physics, vol. 2015, Article ID 423074, 2015. (Year: 2015).*

*Primary Examiner* — Reema Patel
(74) *Attorney, Agent, or Firm* — Tung & Associates

(57) ABSTRACT

A high voltage device includes: a semiconductor layer, a well, a drift oxide region, a body region, a gate, a source, a drain, and a field plate. The well has a first conductivity type, and is formed in a semiconductor layer. The drift oxide region is formed on the semiconductor layer. The body region has a second conductivity type, and is formed in the semiconductor layer, wherein the body region and a drift region are connected in a channel direction. The gate is formed on the semiconductor layer. The source and the drain have the first conductivity type, and are formed in the semiconductor layer, wherein the source and the drain are in the body region and the well, respectively. The field plate is formed on and connected with the drift oxide region, wherein the field plate is electrically conductive and has a temperature coefficient (TC) not higher than 4 ohm/° C.

12 Claims, 8 Drawing Sheets

(51) Int. Cl.
*H01L 21/266* (2006.01)
*H10D 30/01* (2025.01)
*H10D 30/65* (2025.01)
*H10D 62/10* (2025.01)
*H10D 62/17* (2025.01)
*H10D 64/00* (2025.01)

(52) U.S. Cl.
CPC ....... *H10D 30/0281* (2025.01); *H10D 62/116* (2025.01); *H10D 62/393* (2025.01); *H10D 64/111* (2025.01)

(56) References Cited

U.S. PATENT DOCUMENTS

| | | |
|---|---|---|
| 11,424,356 B2 | 8/2022 | Appleton, Jr. et al. |
| 2012/0228704 A1* | 9/2012 | Ju .................... H10D 30/65 |
| | | 257/E29.256 |
| 2019/0334032 A1* | 10/2019 | Ho .................... H10D 30/0285 |
| 2020/0020803 A1 | 1/2020 | Lu et al. |

* cited by examiner

HIGH VOLTAGE DEVICE AND MANUFACTURING METHOD THEREOF

CROSS REFERENCE

The present invention claims priority to TW 111104517 filed on Feb. 8, 2022.

BACKGROUND OF THE INVENTION

Field of Invention

The present invention relates to a high voltage device and a manufacturing method of the high voltage device; particularly, it relates to such high voltage device having a field plate which has a low temperature coefficient, and a manufacturing method thereof.

Description of Related Art

Please refer to FIG. 1A and FIG. 1B. FIG. 1A shows a schematic diagram of a top view of a conventional power device 100, whereas, FIG. 1B shows a schematic diagram of a cross-section view of the conventional power device 100 taken along A-A' line of FIG. 1A. The term "power device" refers to a device through which power is transferred, and when the power device is a transistor device, a voltage applied to the drain thereof in normal operation is higher than a specific voltage, such as 5V. Generally in such transistor device, there is a drift region 12a (as indicated by a dashed frame in FIG. 1B) located between a drain and a gate thereof. The drift region 12a separates the drain 19 from a body region 16, and a lateral length of the drift region 12a can be determined according to an operation voltage the power device 100 requires to withstand in normal operation. As shown in FIG. 1A and FIG. 1B, the power device 100 comprises: a well 12, an isolation structure 13, the body region 16, the gate 17, a source 18 and the drain 19. The well 12 has N conductivity type and is formed on a substrate 11. The isolation structure 33 is a local oxidation of silicon (LOCOS) structure as shown in FIG. 1B, for defining an operation region 13a, which is an active region for the operation of the power device 100. The operation region 13a is as indicated by a thick dashed frame in FIG. 1A. The prior art shown in FIG. 1A and FIG. 1B has the following drawbacks that: in order to enhance the breakdown voltage of the power device 100, a straightforward solution is to prolong the length of the drift region 12a in a channel direction (as shown by the direction of the dashed arrow in FIG. 1B). However, longer length of the drift region 12a will increase the conduction resistance of the power device and undesirably decrease its operation speed. Besides, there is a large difference between the concentration of N type impurities of the drift region 12a and the concentration of N type impurities of the drain 19, and there is a very large voltage difference between the voltage coupled to the drift region 12a and the voltage coupled to the drain 19, and such voltage difference can exceed 5V or can even be as high as several hundred volts; this limits the breakdown voltage of the power device 100 and the application scope of the power device 100, which compromises the performance of the power device 100.

In view of the above, to overcome the drawbacks in the prior art, the present invention proposes a high voltage device having an enhanced breakdown voltage when the high voltage device is in an OFF operation to enhance a withstand voltage of the high voltage device, and having a reduced conduction resistance, wherein the high voltage device is integrated with a field plate having a low temperature coefficient (TC), and the present invention also proposes a manufacturing method thereof.

SUMMARY OF THE INVENTION

From one perspective, the present invention provides a high voltage device, comprising: a semiconductor layer, which is formed on a substrate; a well having a first conductivity type, which is formed in the semiconductor layer; a drift oxide region, which is formed on the semiconductor layer, wherein the drift oxide region is located on a drift region; a body region having a second conductivity type, which is formed in the semiconductor layer, wherein the body region is in contact with the drift oxide region in a channel direction; a gate formed on the semiconductor layer, wherein a part of the body region is located vertically below and in contact with the gate, to serve as an inversion current channel in an ON operation of the high voltage device; a source and a drain having the first conductivity type, which are formed in the semiconductor layer, wherein the source and the drain are located below and outside two sides of the gate respectively, wherein the side of the gate which is closer to the source is a source side and the side of the gate which is closer to the drain is a drain side, and wherein the source is located in the body region, and the drain is located in the well outside the drain side; wherein the drift region is located in the well region between the drain and the body region in the channel direction, to serve as a drift current channel in the ON operation of the high voltage device; and a field plate, which is formed on and in contact with the drift oxide region, wherein the field plate is electrically conductive and has a temperature coefficient (TC) not higher than 4 ohm/° C.

From another perspective, the present invention provides a manufacturing method of the high voltage device, comprising: forming a semiconductor layer on a substrate; forming a well in the semiconductor layer, wherein the well has a first conductivity type; forming a body region in the semiconductor layer, wherein the body region is in contact with a drift region in a channel direction, wherein the body region has a second conductivity type; forming a gate on the semiconductor layer, wherein a part of the body region is located vertically below and in contact with the gate, to serve as an inversion current channel in an ON operation of the high voltage device; forming a source and a drain in the semiconductor layer, wherein the source and the drain are located below and outside two sides of the gate respectively, wherein the side of the gate which is closer to the source is a source side and the side of the gate which is closer to the drain is a drain side, and wherein the source is located in the body region, and the drain is located in the well outside the drain side; wherein the drift region is located in the well region between the drain and the body region in the channel direction, to serve as a drift current channel in the ON operation of the high voltage device; forming a drift oxide region on the semiconductor layer, wherein the drift oxide region is located on the drift region; and forming a field plate on the drift oxide region, wherein the field plate is in contact with the drift oxide region, wherein the field plate is electrically conductive and has a temperature coefficient (TC) not higher than 4 ohm/° C.

In one embodiment, the drift oxide region includes: a shallow trench isolation (STI) structure, a local oxidation of silicon (LOCOS) structure or a chemical vapor deposition (CVD) oxide region.

In one embodiment, the field plate has a length in the channel direction, and the field plate has a width in a width direction which is perpendicular to the channel direction, wherein a ratio of the width to the length is 2:100 or 100:2.

In one embodiment, the field plate serves as a resistor device.

In one embodiment, the field plate serves as an electrode plate of a capacitor device.

In one embodiment, the field plate is electrically connected to the source or the gate, or wherein the field plate is electrically floating.

Advantages of the present invention include: that the present invention can enhance the breakdown voltage of a high voltage device, and also reduce the conduction resistance of the high voltage device.

Advantages of the present invention further include: that the present invention can integrate the process step for forming the field plate of the high voltage device with the process step for forming a resistor or an electrode plate of a capacitor device which is external to the high voltage device, whereby the field plate of the high voltage device and the resistor or the electrode plate of the capacitor device external to the high voltage device can be formed by one and the same process step without any additional extra process step.

The objectives, technical details, features, and effects of the present invention will be better understood with regard to the detailed description of the embodiments below, with reference to the attached drawings.

BRIEF DESCRIPTION OF THE DRAWINGS

FIG. 1A shows a schematic diagram of a top view of a conventional high voltage device 100, whereas.

DESCRIPTION OF THE PREFERRED EMBODIMENTS

The drawings as referred to throughout the description of the present invention are for illustration only, to show the interrelations among the process steps and the layers, while the shapes, thicknesses, and widths are not drawn in actual scale.

Figure 1A:
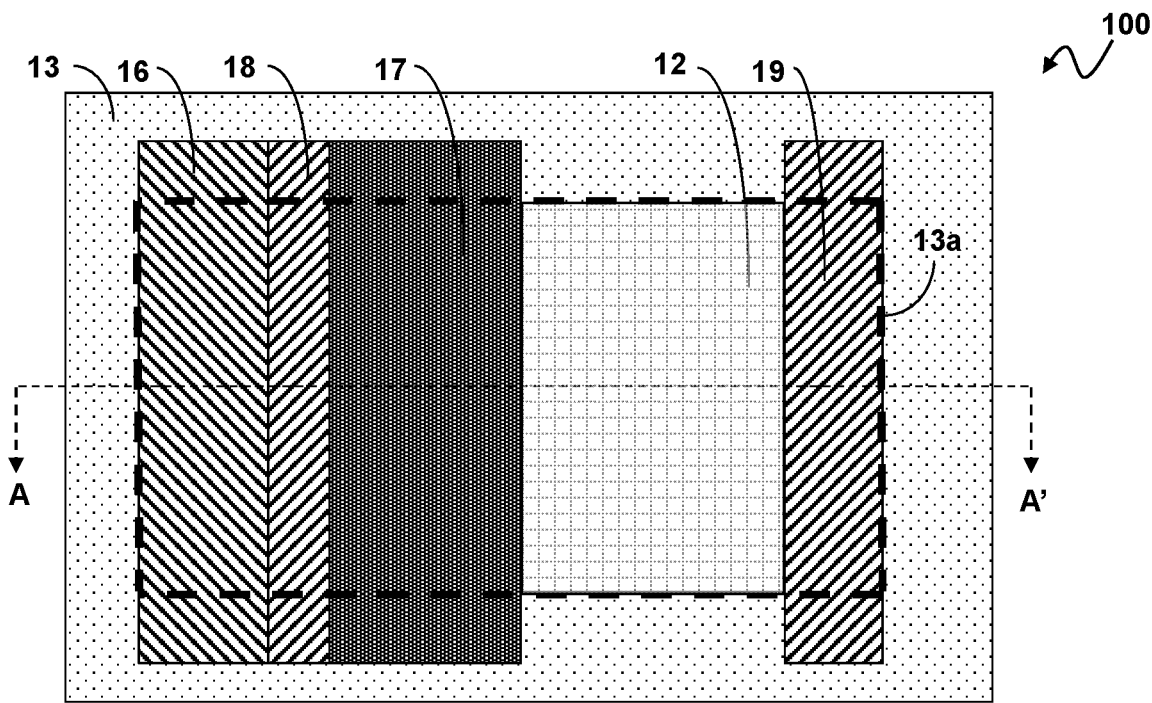
Figure 1B:
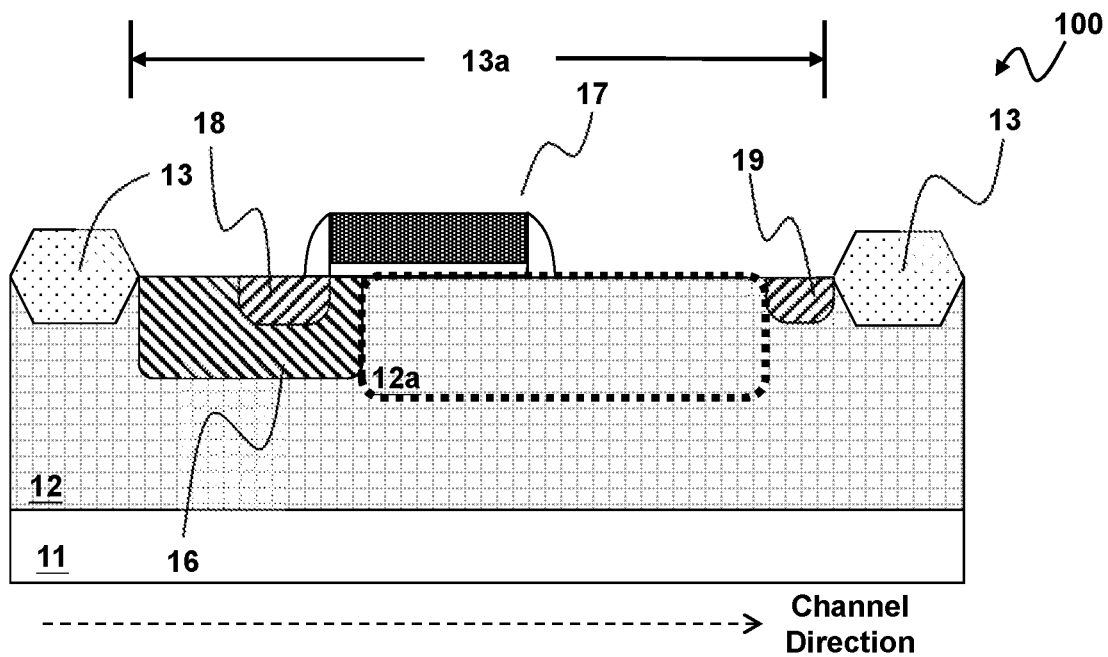
FIG. 1B shows a schematic diagram of a cross-section view of the conventional high voltage device 100.
Figure 2A:
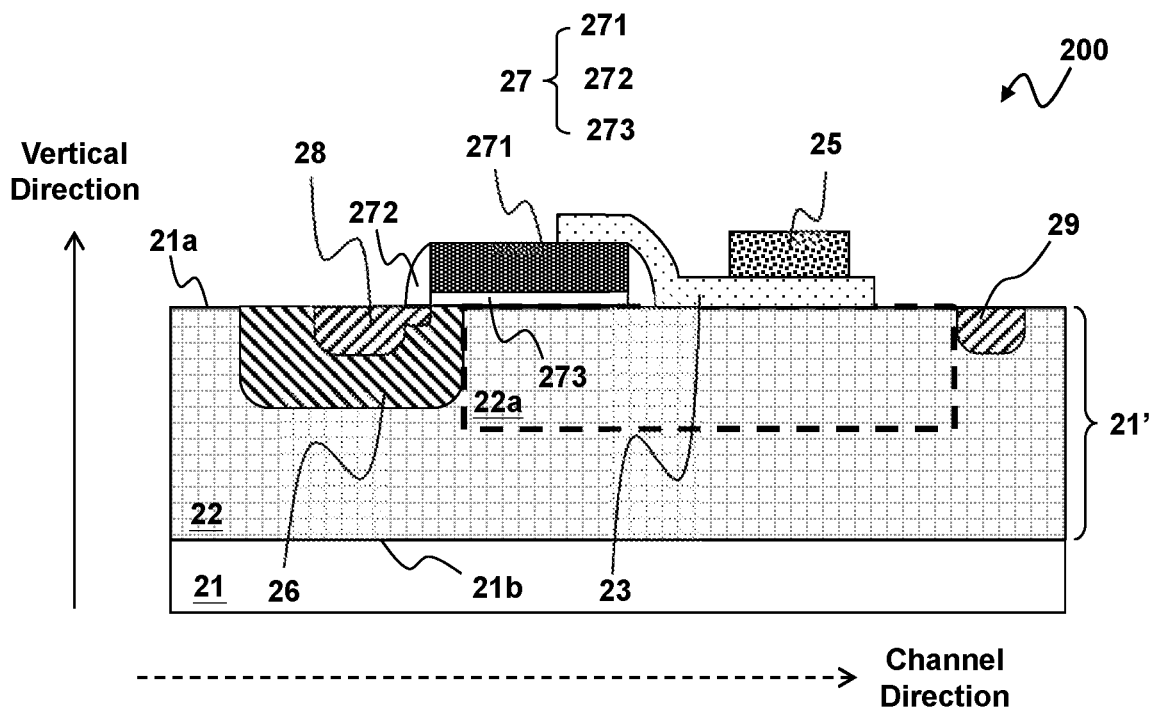
FIGS. 2A and 2B show a cross-section view and a top view of a high voltage device according to an embodiment of the present invention, respectively.
Figure 2B:
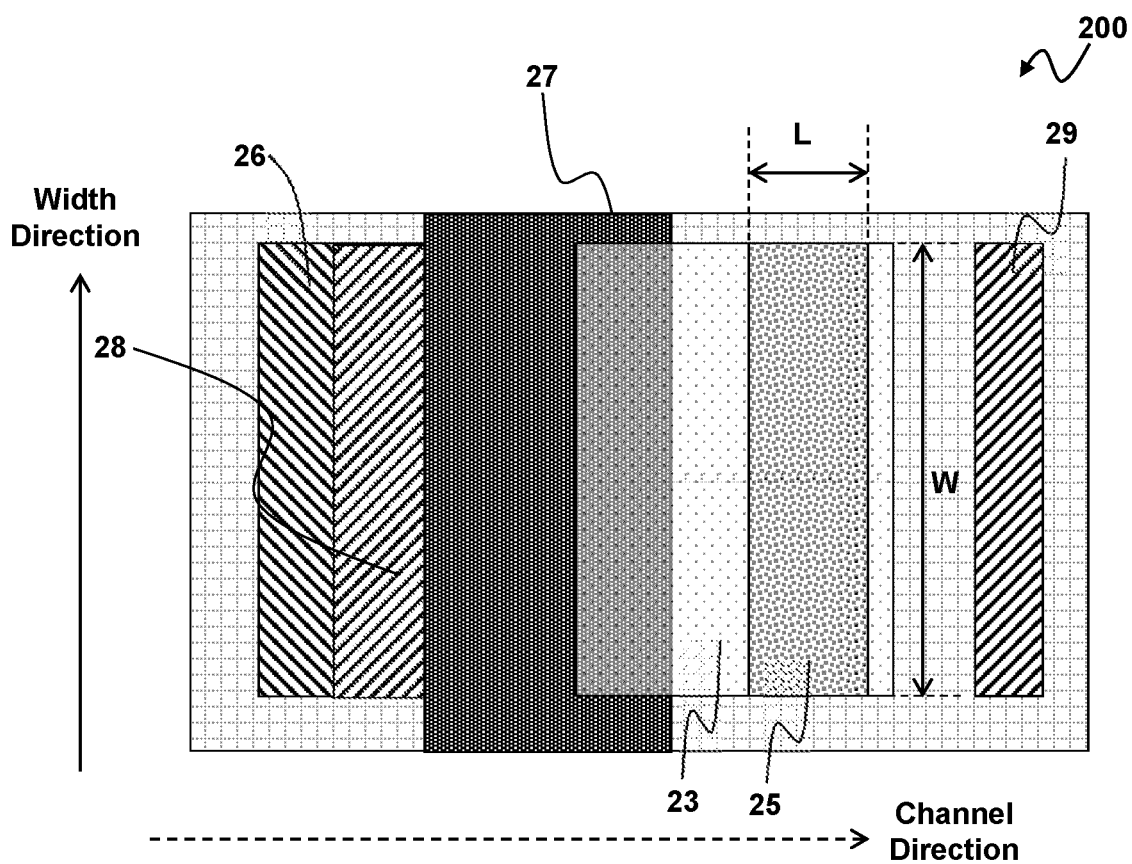

Please refer to FIG. 2A and FIG. 2B, which show a cross-section view and a top view of a high voltage device according to an embodiment of the present invention, respectively. As shown in FIG. 2A and FIG. 2B, the high voltage device 200 comprises: a semiconductor layer 21', a well 22, a drift oxide region 23, a field plate 25, a body region 26, a gate 27, a source 28 and a drain 29. The semiconductor layer 21' is formed on the substrate 21, and the semiconductor layer 21' has a top surface 21a and a bottom surface 21b that is opposite to the top surface 21a in a vertical direction (as indicated by the direction of the solid arrow in FIG. 2A). The substrate 21 is, for example but not limited to, a P conductivity type or an N conductivity type silicon substrate. The semiconductor layer 21', for example, is formed on the substrate 21 by an epitaxial growth process step, or, a part of the substrate 21 is used as the semiconductor layer 21'. The semiconductor layer 21' can be formed by any method known to a person having ordinary skill in the art, so the details thereof are not redundantly explained here.

Please still refer to FIG. 2A and FIG. 2B. The drift oxide region 23 is formed on the semiconductor layer 21', wherein the drift oxide region 23 is located on a drift region 22a (as indicated by a thick dashed frame in FIG. 2A). The well 22 has a first conductivity type, and is formed in the semiconductor layer 21'. The well 22 is located below and in contact with the top surface 21a in the vertical direction. The well 22 is formed for example via at least one ion implantation process step. The body region 26 has a second conductivity type, and is formed in the well 22. The body region 26 is located below and in contact with the top surface 21a. The body region 26 is in contact with the drift region in a channel direction (as indicated by the direction of the dashed arrow in FIG. 2A and FIG. 2B).

The gate 27 is formed on the top surface 21a of the semiconductor layer 21'. From top view, the gate 27 is substantially a rectangular shape extending along a width direction (as indicated by the direction of the solid arrow in FIG. 2B). Part of the body region 26 is located vertically below and in contact with the gate 27 in the vertical direction, to serve as an inversion current channel in an ON operation of the high voltage device 200. The gate 27 includes: a conductive layer 271, a spacer layer 272 and a dielectric layer 273.

Each of the source 28 and the drain 29 has the first conductivity type, and is formed below and in contact with the top surface 21a. The source 28 and the drain 29 are located below and outside two sides of the gate 27 in the channel direction (as indicated by the direction of the dashed arrow in FIG. 2A and FIG. 2B), respectively. The side of the gate 27 which is closer to the source 28 is a source side and the side of the gate 27 which is closer to the drain 29 is a drain side, wherein the source 28 is located in the body region 26, and the drain 29 is located in the well 22 outside the drain side. A drift region 22a is formed in the well 22 near the top surface 21a and between the drain 29 and the body region 26 in the channel direction, to separate the drain 29 from the body region 26 and to serve as a drift current channel in the ON operation of the high voltage device 200. From the cross-section view of FIG. 2A, in the vertical direction, each of the source 28 and the drain 29 is formed below and in contact with the top surface 21a. The field plate 25 is formed on and in contact with the drift oxide region 23, wherein the field plate 25 is electrically conductive and has a temperature coefficient (TC) not higher than 4 ohm/° C.

In one embodiment, the field plate 25 can serve as a resistor device which has a low temperature coefficient, wherein such resistor device is an external device outside the high voltage device 200, whereby an extra process step for manufacturing a resistor device can be saved, to reduce the manufacture cost.

In one embodiment, the field plate 25 can serve as an electrode plate of a capacitor device, wherein such capacitor device is an external device outside the high voltage device 200, whereby an extra process step for manufacturing a capacitor device can be saved, to reduce the manufacture cost. In one embodiment, the capacitor device can be for example a metal-insulator-polysilicon (MIP) capacitor.

In one embodiment, the field plate 25 is electrically connected to the source 28 or the gate 27. Or, in another embodiment, the field plate 25 is floating.

In one embodiment, the drift oxide region 23 is a chemical vapor deposition (CVD) oxide region.

In one embodiment, as shown in FIG. 2B, the field plate 25 has a length L in the channel direction, and the field plate 25 has a width W in the width direction, wherein a ratio of the width W to the length L is 2:100 or 100:2.

As compared to the prior art, the high voltage device according to the present invention further comprises a drift oxide region and a field plate. When the high voltage device is in an ON operation, the present invention can accumulate more carriers by electrically connecting the field plate to an appropriate voltage, so as to reduce the conduction resistance. Besides, during an ON operation or OFF operation of the high voltage device, the electric field applied by the field plate can prevent the electric field to concentrate on the surface adjacent to the drain, so that distribution of the electric field can be expanded, thereby enhancing the breakdown voltage of the high voltage device. Additionally, because the high voltage device according to the present invention adopts a field plate which is electrically conductive and which has a relatively lower temperature coefficient (TC), in addition to the above-mentioned advantages, the field plate can be used to serve as a resistor or an electrode plate of a capacitor device, wherein the resistor or the capacitor device is an external device outside the high voltage device; thus, an extra process step for manufacturing such resistor device or such electrode plate of such capacitor device can be saved, to reduce the manufacture cost.

Note that the term "inversion current channel" means thus. Taking this embodiment as an example, when the high voltage device 200 operates in ON operation due to the voltage applied to the gate 27, an inversion layer is formed below the gate 27, so that a conduction current flows through the region of the inversion layer, which is the inverse current channel known to a person having ordinary skill in the art.

Note that the term "drift current channel" means thus. Taking this embodiment as an example, the drift current channel refers to a region where the conduction current passes through in a drifting manner when the high voltage device 200 operates in ON operation, which is known to a person having ordinary skill in the art.

Note that the top surface 21a as referred to does not mean a completely flat plane but refers to the surface of the semiconductor layer 21'. In this embodiment, for example, a portion of the top surface 21a where the drift oxidation region 24 is in contact with the top surface 21a has a recess portion.

Note that the gate 27 includes: a conductive layer 271, a dielectric layer 273 which is in contact with the top surface 21a, and a spacer layer 272 which is insulative. The dielectric layer 23 is formed on the body region 26 and the well 22, and is in contact with the body region 26 and the well 22. The conductive layer 271 serves as an electrical contact of the gate 27, and is formed on the dielectric layer 273 and in contact with the dielectric layer 273. The spacer layer 272 is formed out of two sides of the conductive layer 271, as an electrical insulative layer of the gate 27, which is known to a person having ordinary skill in the art, so the details thereof are not redundantly explained here.

Note that the above-mentioned "first conductivity type" and "second conductivity type" mean that impurities of corresponding conductivity types are doped in regions of the high voltage device (for example but not limited to the aforementioned well region, body region, source and drain, etc.), so that the regions have the corresponding conductivity types. For example, the first conductivity type is N-type and the second conductivity type is P-type, or the first conductivity type is P-type and the second conductivity type is N-type. The first conductivity type is opposite to the second conductivity type.

In addition, the term "high voltage device" refers to a transistor device wherein a voltage applied to the drain thereof in normal operation is higher than a specific voltage, such as 5V. A lateral distance (length of the drift region 22a) between the body region 26 and the drain 29 of the high voltage device 200 is determined according to the required operation voltage during normal operation, so that the device can operate at or higher than the aforementioned specific voltage, which is known to a person having ordinary skill in the art, so the details thereof are not redundantly explained here.

Figure 3A:
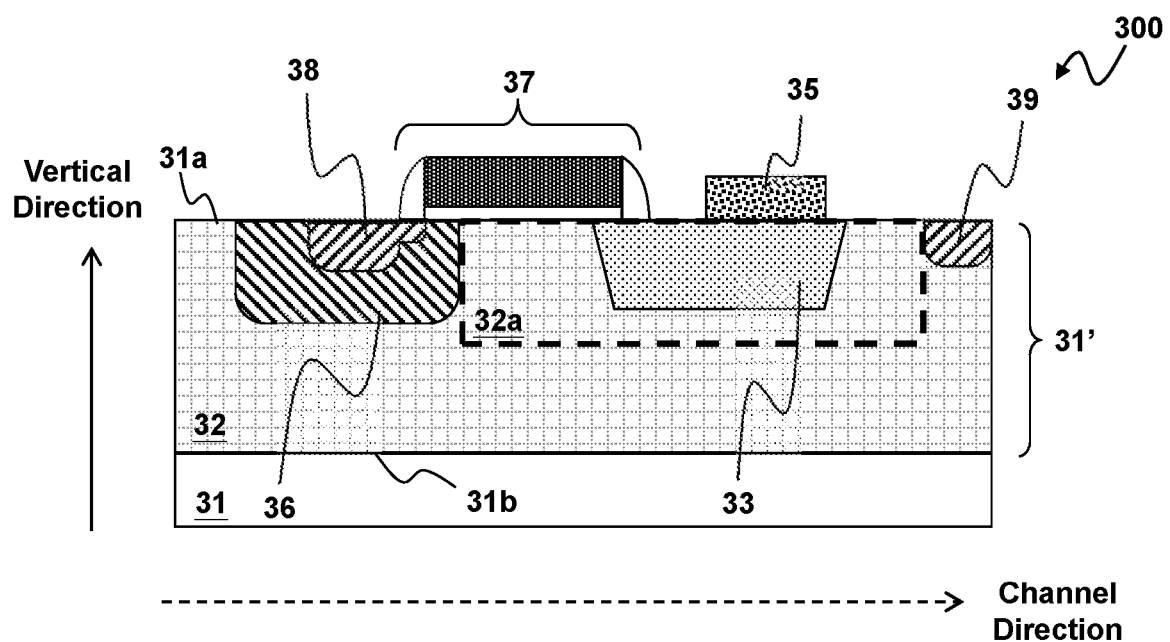
FIGS. 3A and 3B show a cross-section view and a top view of a high voltage device according to another embodiment of the present invention, respectively.
Figure 3B:
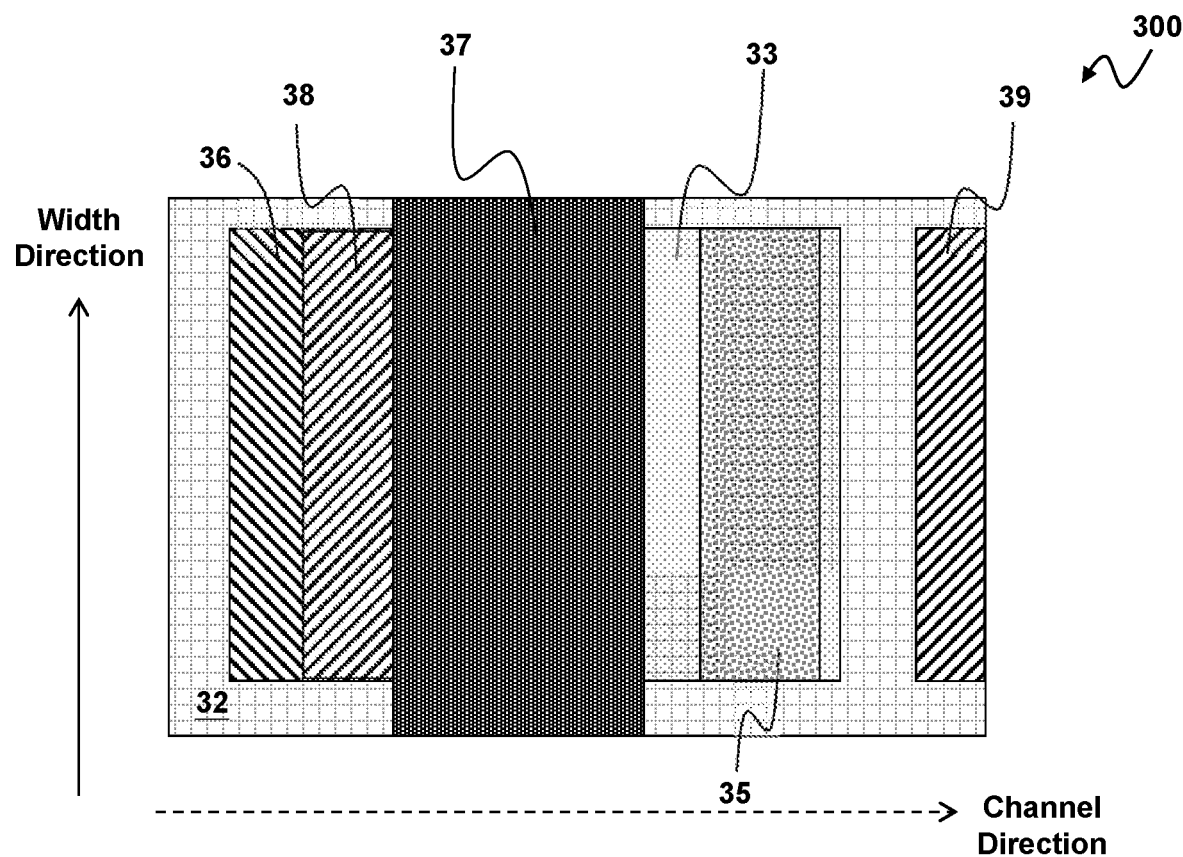

Please refer to FIG. 3A and FIG. 3B. FIGS. 3A and 3B show a cross-section view and a top view of a high voltage device 300 according to another embodiment of the present invention, respectively. This embodiment of FIG. 3A and FIG. 3B is different from the embodiment of FIG. 2A and FIG. 2B, in that: the drift oxide region 33 of this embodiment is a shallow trench isolation (STI) structure. The substrate 31, the top surface 31a, the bottom surface 31b, the semiconductor layer 31', the well 32, the drift region 32a, the field plate 35, the body region 36, the gate 37, the source 38 and the drain 39 of this embodiment of FIG. 3A and FIG. 3B are similar to the substrate 21, the top surface 21a, the bottom surface 21b, the semiconductor layer 21', the well 22, the drift region 22a, the drift oxide region 23, the field plate 25, the body region 26, the gate 27, the source 28 and the drain 29 of the embodiment of FIG. 2A and FIG. 2B, so the details thereof are not redundantly repeated here.

Figure 4A:
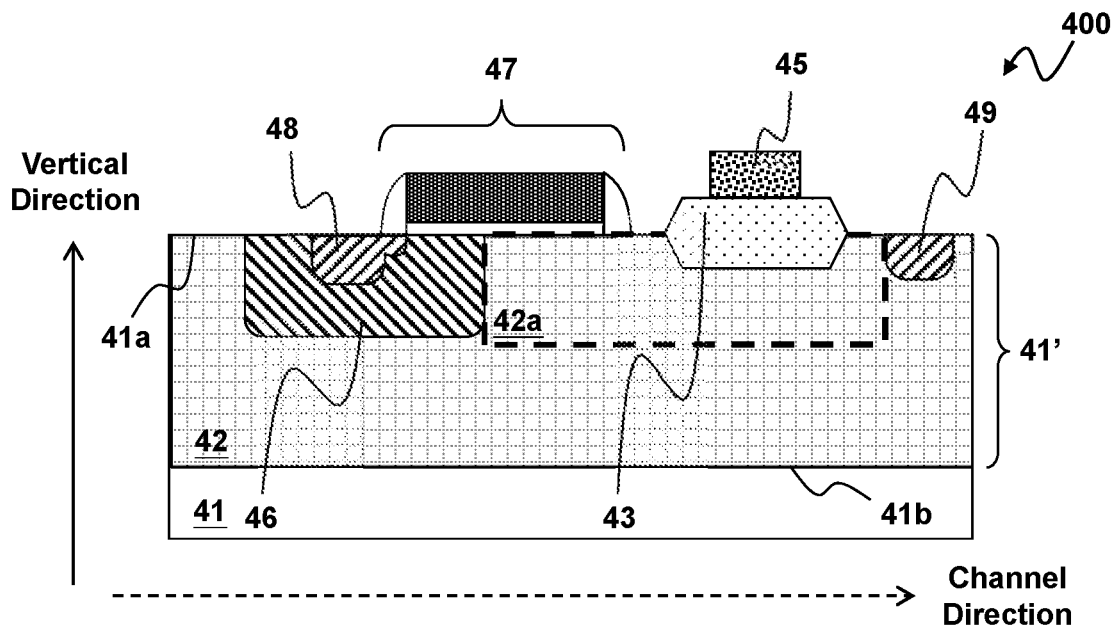
FIGS. 4A and 4B show a cross-section view and a top view of a high voltage device according to another embodiment of the present invention, respectively.
Figure 4B:
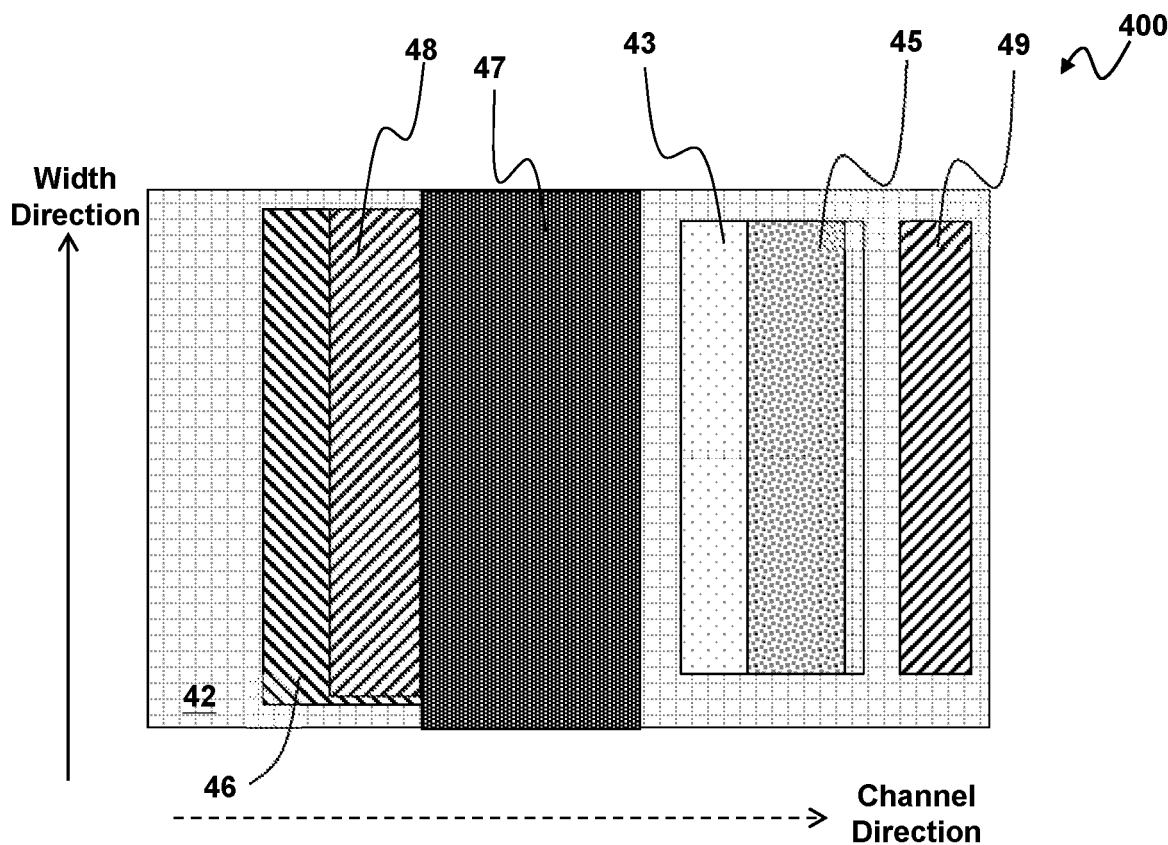

Please refer to FIG. 4A and FIG. 4B. FIGS. 4A and 4B show a cross-section view and a top view of a high voltage device 300 according to yet another embodiment of the present invention, respectively. This embodiment of FIG. 4A and FIG. 4B is different from the embodiment of FIG. 2A and FIG. 2B, in that: the drift oxide region 43 of this embodiment is a local oxidation of silicon (LOCOS) structure. The substrate 41, the top surface 41a, the bottom surface 41b, the semiconductor layer 41', the well 42, the drift region 42a, the field plate 45, the body region 46, the gate 47, the source 48 and the drain 49 of this embodiment of FIG. 4A and FIG. 4B are similar to the substrate 21, the top surface 21a, the bottom surface 21b, the semiconductor layer 21', the well 22, the drift region 22a, the drift oxide region 23, the field plate 25, the body region 26, the gate 27, the source 28 and the drain 29 the embodiment of FIG. 2A and FIG. 2B, so the details thereof are not redundantly repeated here.

Figure 5A:
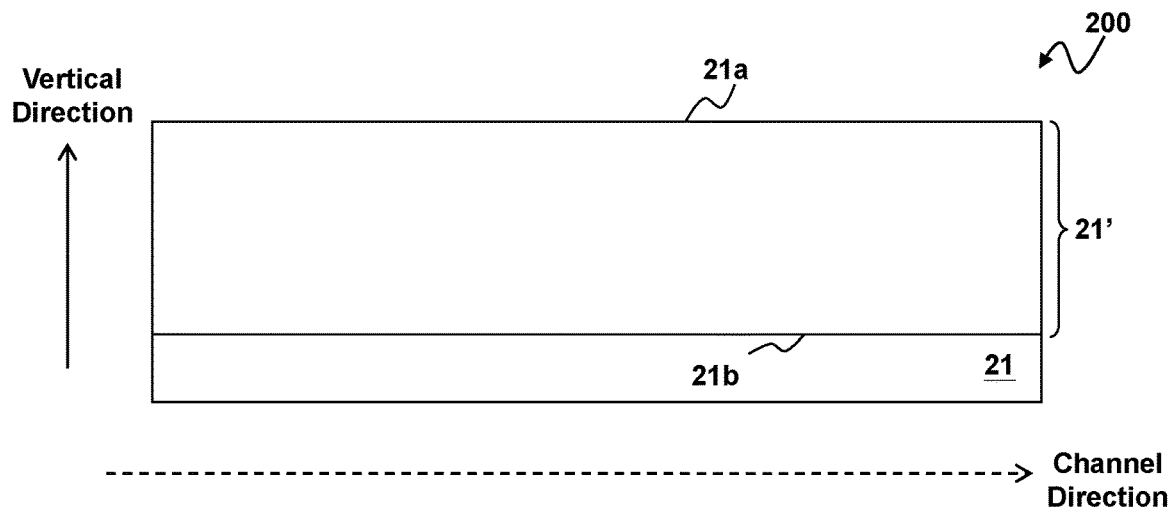
FIG. 5A to FIG. 5H show cross-section views of a manufacturing method for a high voltage device according to an embodiment of the present invention.

Please refer to FIG. 5A to FIG. 5H, which show cross-section views of a manufacturing method for a high voltage device according to an embodiment of the present invention. First, as shown in FIG. 5A, a semiconductor layer 21' is formed on the substrate 21, and the semiconductor layer 21' has a top surface 21a and a bottom surface 21b that is opposite to the top surface 21a in a vertical direction (as indicated by the direction of the solid arrow in FIG. 5A). The semiconductor layer 21', for example, is formed on the substrate 21 by an epitaxial growth process step, or, a part of the substrate 21 is used as the semiconductor layer 21'. The semiconductor layer 21' can be formed by any method known to a person having ordinary skill in the art, so the details thereof are not redundantly explained here.

Figure 5B:
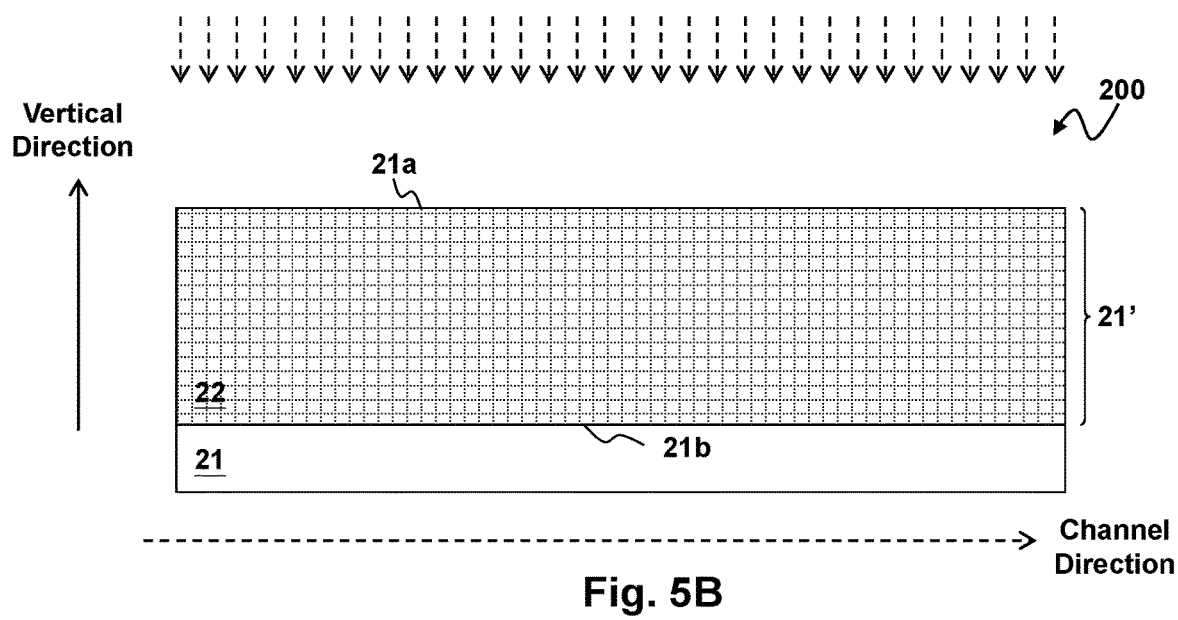

Next, please refer to FIG. 5B. The well 22 can be formed by, for example but not limited to, at least one ion implantation process step which implants first conductivity type impurities in the semiconductor layer 21' in the form of accelerated ions, to form the well 22. At this moment, the drift oxide region 23 has not yet been formed, and the top surface 21a has not yet been defined (referring to FIG. 2A). The well 22 is formed in the semiconductor layer 21'. The well 22 is located below and in contact with the top surface 21a in the vertical direction.

Figure 5C:
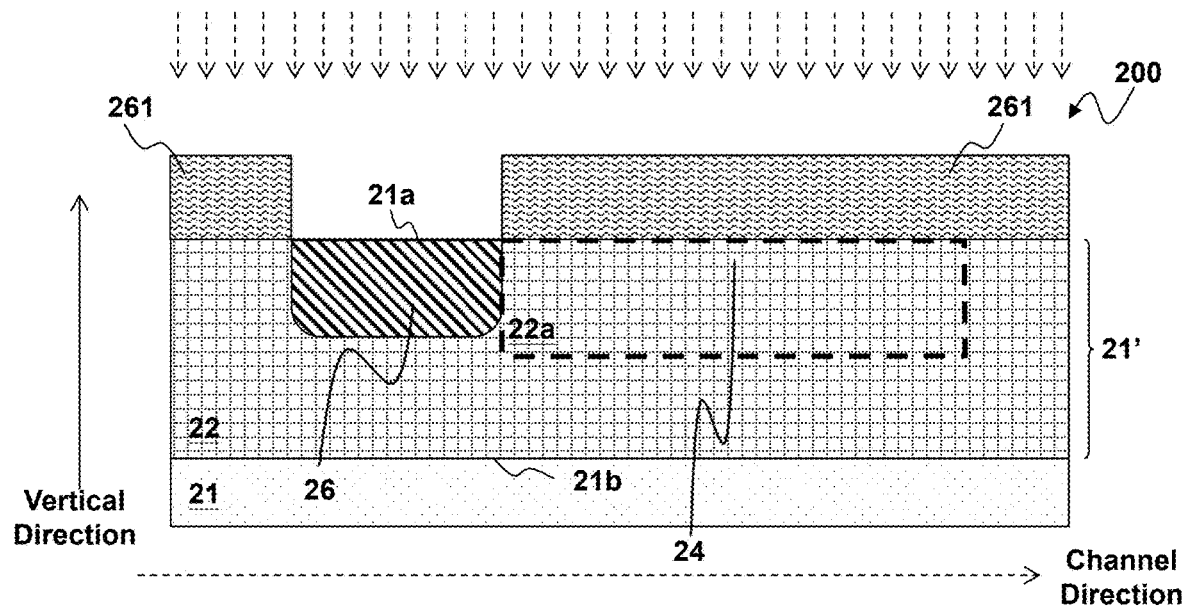

Next, please refer to FIG. 5C. The body region 26 is formed in the well 22. The body region 26 is located below and in contact with the top surface 21a. The body region 26 has a second conductivity type. The body region 26 can be formed by steps including, for example but not limited to, a lithography process step which forms a photo-resist layer 261 as a mask, and an ion implantation step which dopes second conductivity type impurities in the well 22 of the semiconductor layer 21' in the form of accelerated ions as indicated by the vertical dashed arrows shown in FIG. 5C, to form the body region 26.

Figure 5D:
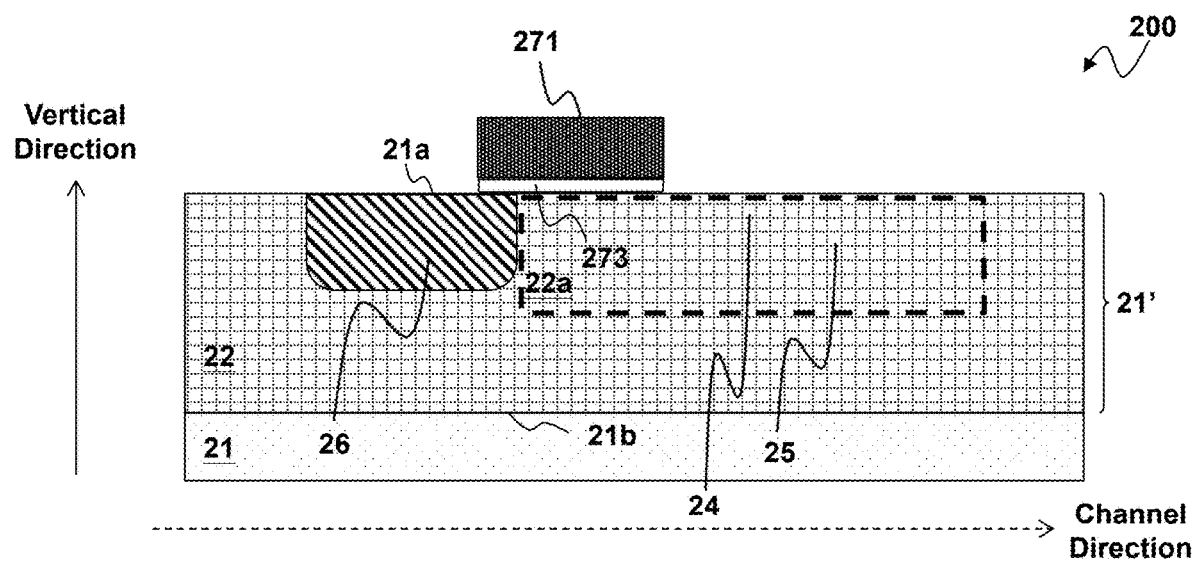

Next, please refer to FIG. 5D. A dielectric layer 273 of a gate 27 and a conductive layer 271 of the gate 27 are formed on the top surface 21a of the semiconductor layer 21'. And, in the vertical direction (as indicated by the direction of the solid arrow in FIG. 5D), part of the body region 26 is located vertically below the gate 27, to serve as a drift current channel in the ON operation of the high voltage device 200.

Figure 5E:
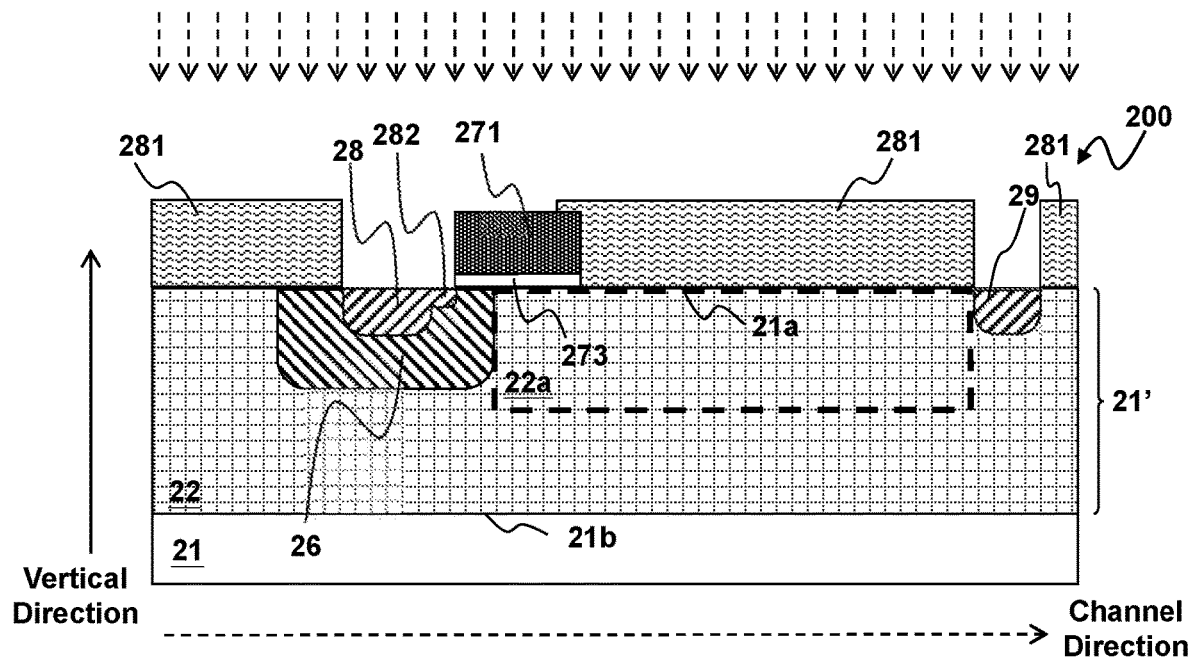

Please refer to FIG. 5E in conjugation with FIG. 2A. After the dielectric layer 273 and the conductive layer 271 of the gate 27 are formed, a lightly doped region 282 is formed, so as to provide a conduction channel below the spacer layer 272 in the ON operation of the high voltage device 200. To provide the lightly doped region 282 is because the body region 26 beneath the spacer layer 272 cannot form the inversion current channel in the ON operation of the high voltage device 200. The lightly doped region 282 can be formed for example by implanting first conductivity type impurities into the body region 26 in the form of accelerated ions in an ion implantation step (as indicated by the vertical dashed arrows in FIG. 5E). Because the concentration of the first conductivity type impurities in the lightly doped region 282 is far lower than concentration of the first conductivity type impurities in the source 28, in a region where the lightly doped region 282 overlaps with the source 28, the lightly doped region 282 can be omitted; for this sake, this region of the lightly doped region 282 is also omitted in the following figures.

Please still refer to FIG. 5E. As shown in FIG. 5E, in the vertical direction, each of the source 28 and the drain 29 is formed below and in contact with the top surface 21a. The source 28 and the drain 29 are located below and outside two sides of the gate 27, respectively. The side of the gate 27 which is closer to the source 28 is a source side and the side of the gate 27 which is closer to the drain 29 is a drain side, wherein the source 28 is located in the body region 26, and the drain 29 is located in the well 22 outside the drain side. A drift region 22a is formed in the well 22 near the top surface 21a and between the drain 29 and the body region 26 in the channel direction, to separate the drain 29 from the body region 26 and to serve as a drift current channel in the ON operation of the high voltage device 200. Each of the source 28 and the drain 29 has the first conductivity type, wherein the source 28 and the drain 29 can be formed by steps including, for example but not limited to, a lithography process step which forms a photo-resist layer 281 as a mask and an ion implantation process step which implants first conductivity type impurities in the body region 26 and the well 22 in the form of accelerated ions (as indicated by the vertical dashed arrows shown in FIG. 5G), to form the source 28 and the drain 29.

Figure 5F:
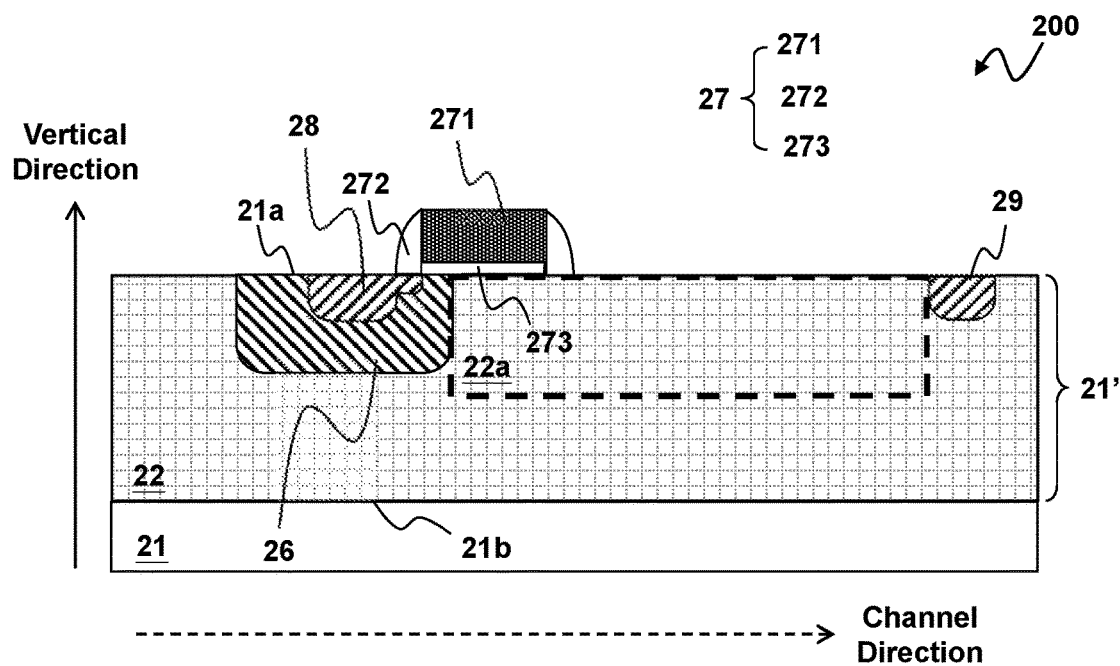

Next, please refer to FIG. 5F. A spacer layer 272 is formed outside of the lateral surface of the conductive layer 271, to complete the formation of the gate 27.

Figure 5G:
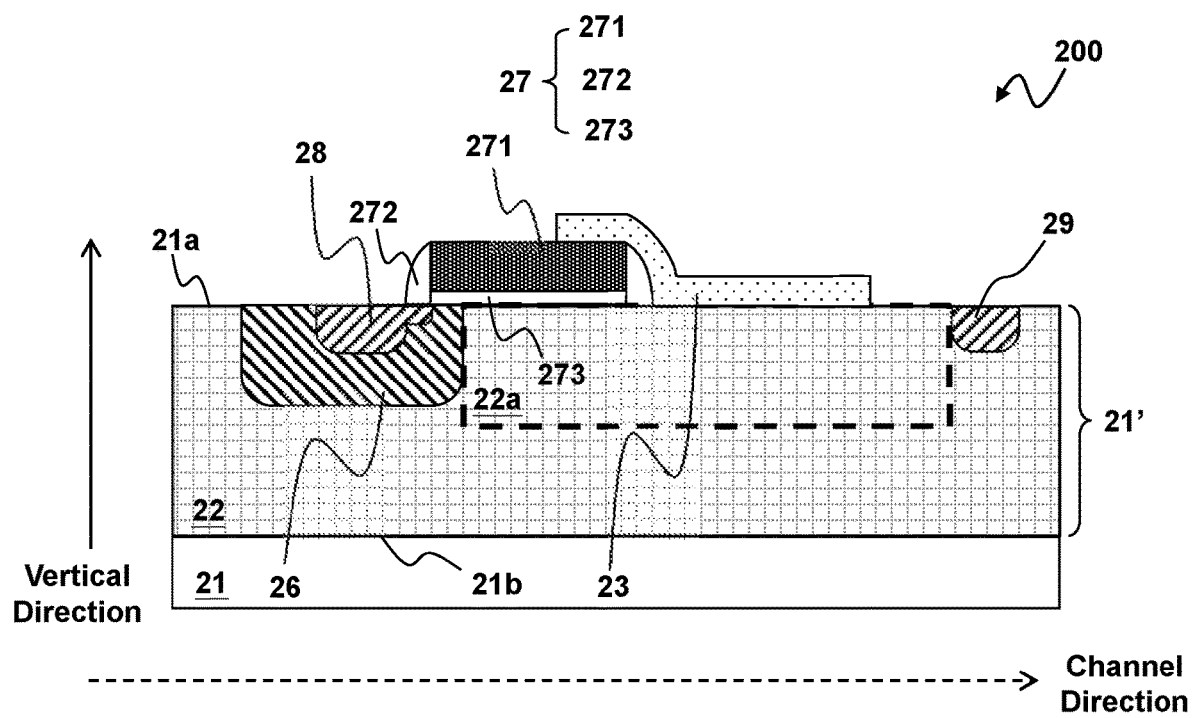
Figure 5H:
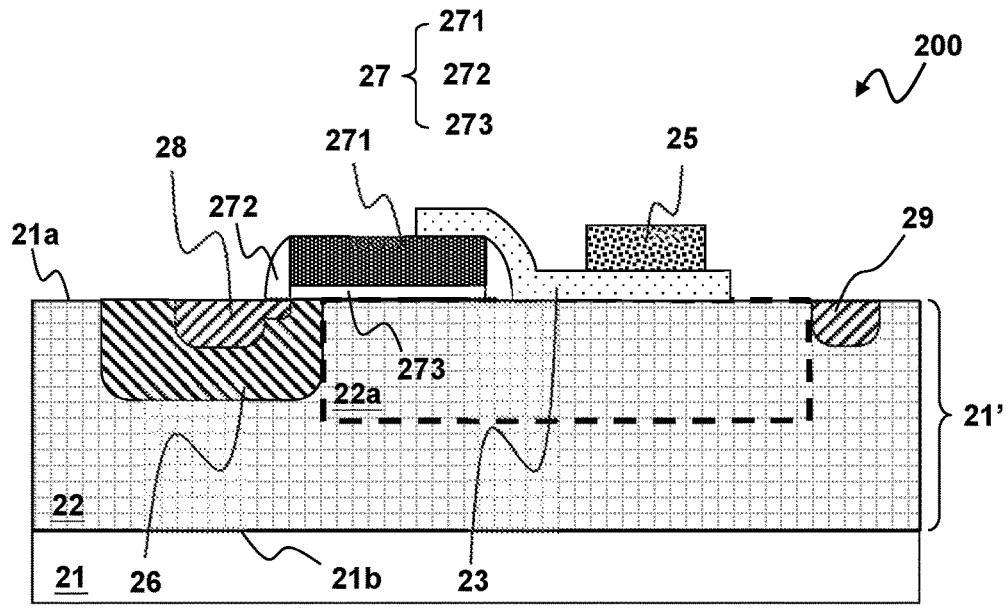

Next, please refer to FIG. 5G. A drift oxide region 23 is formed on the semiconductor layer 21', wherein the drift oxide region 23 is located on a drift region 22a (as indicated by a thick dashed frame in FIG. 5G) and is in contact with the well 22. The drift oxide region 23 is for example a chemical vapor deposition (CVD) oxide region.

Next, please still refer to FIG. 5G. A field plate 25 is formed on and in contact with the drift oxide region 23, wherein the field plate 25 is electrically conductive and has a temperature coefficient (TC) not higher than 4 ohm/° C.

In one embodiment, the field plate 25 can serve as an electrode plate of a capacitor device external to the high voltage device 200. In this way, the process steps for forming an electrode plate of a capacitor device can be saved to reduce the manufacture cost. In one embodiment, the capacitor device can be for example a metal-insulator-polysilicon (MIP) capacitor.

In one embodiment, the field plate 25 is electrically connected to the source 28 or the gate 27. Or, in another embodiment, the field plate 25 is floating.

In one embodiment, as shown in FIG. 2B, the field plate 25 has a length L in the channel direction, and the field plate 25 has a width W in the width direction, wherein a ratio of the width W to the length L is 2:100 or 100:2.

The present invention has been described in considerable detail with reference to certain preferred embodiments thereof. It should be understood that the description is for illustrative purpose, not for limiting the broadest scope of the present invention. Those skilled in this art can readily conceive variations and modifications within the spirit of the present invention. The various embodiments described above are not limited to being used alone; two embodiments may be used in combination, or a part of one embodiment may be used in another embodiment. For example, other process steps or structures, such as a deep well region, may be added. For another example, the lithography process step is not limited to the mask technology but it can also include electron beam lithography, immersion lithography, etc. Therefore, in the same spirit of the present invention, those skilled in the art can think of various equivalent variations and various combinations, and there are many combinations thereof, and the description will not be repeated here. The scope of the present invention should include what are defined in the claims and the equivalents.

What is claimed is:

1. A high voltage device, comprising:
a semiconductor layer, which is formed on a substrate;
a well having a first conductivity type, which is formed in the semiconductor layer;
a drift oxide region, which is formed on the semiconductor layer, wherein the drift oxide region is located on a drift region;
a body region having a second conductivity type, which is formed in the semiconductor layer, wherein the body region is in contact with the drift region in a channel direction;
a gate formed on the semiconductor layer, wherein a part of the body region is located vertically below and in contact with the gate, to form an inversion current channel having a doped region with the second conductivity type, through which a conduction current is configured to flow in an ON operation of the high voltage device;

a source and a drain having the first conductivity type, which are formed in the semiconductor layer, wherein the source and the drain are located below and outside two sides of the gate respectively, wherein the side of the gate which is closer to the source is a source side and the side of the gate which is closer to the drain is a drain side, and wherein the source is located in the body region, and the drain is located in the well outside the drain side; wherein the drift region is located in the well region between the drain and the body region in the channel direction, to form a drift current channel having a doped region with the first conductivity type, through which the conduction current is configured to flow in the ON operation of the high voltage device; and a field plate, which is formed on and in contact with the drift oxide region, wherein the field plate is electrically conductive and has a temperature coefficient (TC) not higher than 4 ohm/° C.

2. The high voltage device of claim 1, wherein the drift oxide region includes: a shallow trench isolation (STI) structure, a local oxidation of silicon (LOCOS) structure or a chemical vapor deposition (CVD) oxide region.

3. The high voltage device of claim 1, wherein the field plate has a length in the channel direction, and the field plate has a width in a width direction which is perpendicular to the channel direction, wherein a ratio of the width to the length is 2:100 or 100:2.

4. The high voltage device of claim 1, wherein the field plate serves as a resistor device.

5. The high voltage device of claim 1, wherein the field plate serves as an electrode plate of a capacitor device.

6. The high voltage device of claim 1, wherein the field plate is electrically connected to the source or the gate, or wherein the field plate is electrically floating.

7. A manufacturing method of the high voltage device, comprising:

forming a semiconductor layer on a substrate;

forming a well in the semiconductor layer, wherein the well has a first conductivity type;

forming a body region in the semiconductor layer, wherein the body region is in contact with a drift region in a channel direction, wherein the body region has a second conductivity type;

forming a gate on the semiconductor layer, wherein a part of the body region is located vertically below and in contact with the gate, to form an inversion current channel having a doped region with the second conductivity type, through which a conduction current is configured to flow in an ON operation of the high voltage device;

forming a source and a drain in the semiconductor layer, wherein the source and the drain are located below and outside two sides of the gate respectively, wherein the side of the gate which is closer to the source is a source side and the side of the gate which is closer to the drain is a drain side, and wherein the source is located in the body region, and the drain is located in the well outside the drain side; wherein the drift region is located in the well region between the drain and the body region in the channel direction, to form a drift current channel having a doped region with the first conductivity type, through which the conduction current is configured to flow in the ON operation of the high voltage device;

forming a drift oxide region on the semiconductor layer, wherein the drift oxide region is located on the drift region; and forming a field plate on the drift oxide region, wherein the field plate is in contact with the drift oxide region, wherein the field plate is electrically conductive and has a temperature coefficient (TC) not higher than 4 ohm/° C.

8. The manufacturing method of claim 7, wherein the drift oxide region includes: a shallow trench isolation (STI) structure, a local oxidation of silicon (LOCOS) structure or a chemical vapor deposition (CVD) oxide region.

9. The manufacturing method of claim 7, wherein the field plate has a length in the channel direction, and the field plate has a width in a width direction which is perpendicular to the channel direction, wherein a ratio of the width to the length is 2:100 or 100:2.

10. The manufacturing method of claim 7, wherein the field plate serves as a resistor device.

11. The manufacturing method of claim 7, wherein the field plate serves as an electrode plate of a capacitor device.

12. The manufacturing method of claim 7, wherein the field plate is electrically connected to the source or the gate, or wherein the field plate is floating.

* * * * *